United States Patent [19]

Henry

[11] 3,858,200

[45] Dec. 31, 1974

[54] VARIABLE THRESHOLD FLASH ENCODER ANALOG-TO-DIGITAL CONVERTER

[75] Inventor: Tim Warren Henry, Tempe, Ariz.

[73] Assignee: Motorola, Inc., Franklin Park, Ill.

[22] Filed: Jan. 29, 1973

[21] Appl. No.: 327,334

[52] U.S. Cl. .......... 340/347 AD

[51] Int. Cl. .......... H03k 13/00

[58] Field of Search .......... 340/347 AD

[56] References Cited

UNITED STATES PATENTS

| | | | |
|---|---|---|---|
| 3,100,298 | 8/1963 | Fluhr | 340/347 AD |
| 3,573,798 | 4/1971 | Reiling | 340/347 AD |
| 3,587,089 | 6/1971 | Elliott | 340/347 AD |
| 3,594,766 | 7/1971 | Gilbert | 340/347 AD |
| 3,623,071 | 11/1971 | Bentlye | 340/347 AD |
| 3,676,600 | 7/1972 | Kaneko et al. | 340/347 AD |

OTHER PUBLICATIONS

Beisner; "Analog-to-digital Conversion Device," IBM Technical Disclosure Bulletin; Vol. 7, No. 11, April 1965, pp. 1054–1055.

*Primary Examiner*—Malcolm A. Morrison
*Assistant Examiner*—Errol A. Krass
*Attorney, Agent, or Firm*—Vincent J. Rauner; Kenneth R. Stevens

[57] ABSTRACT

An analog-to-digital converter for providing a binary word of *n* bits representative of an analog voltage input has *n* comparator circuits. Each comparator circuit has an input terminal for receiving the analog signal to be converted and each has a threshold terminal. When the analog input signal exceeds the voltage threshold on any of the threshold terminals, the associated comparator circuit provides an output.

The voltage threshold provided to each comparator circuit utilizes a current source producing a prescribed amount of current which is conducted through a resistance. The voltage threshold at any of the threshold terminals may be selectively increased by switching a prescribed amount of additional current through the respective resistance as determined by the state of any of the other comparator circuits in accordance with the desired output binary code.

12 Claims, 3 Drawing Figures

| | A | B | C |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

Fig. 3

VARIABLE THRESHOLD FLASH ENCODER ANALOG-TO-DIGITAL CONVERTER

BACKGROUND OF THE INVENTION

This invention relates to analog-to-digital converters and more particularly to a converter utilizing an electronic comparator arrangement for digitizing an analog signal.

An analog-to-digital converter is a device which responds to an input analog voltage by presenting at its output a binary word comprised of a plurality of bits in either a serial train or in parallel from a plurality of output stages. In general, analog-to-digital converters may be classified in four major categories.

The first of these is the serial converter with $n$ stages and an output code with $2n$ discrete values. In this type of system, the input is applied to the first stage. The first stage compares the input to a predetermined half scale value and provides one output voltage (arbitrarily designated a "1") in the most significant bit of the output binary word if the input is greater than half scale. The first stage provides another output voltage (arbitrarily designated a "0") if the input is less than half scale. If the first stage produces a "1" output, indicating the input voltage is greater than half scale, it then subtracts, by analog means, the half scale voltage from the input voltage. This remainder is then fed as an input signal to the second stage. If however the input signal is less than half scale, the output of the first stage is a "0." In this case the input voltage is fed directly to the second stage without the analog subtraction. The second stage of the converter operates in exactly the same manner as described above for the first input except that the second stage input voltage is compared to one-quarter scale rather than one-half scale. Each successive stage operates in a corresponding manner with the comparison voltage being one-half of the value of the previous stage. The most commonly used output code of this type of converter is a standard binary number. Other codes used include the reflected binary or Grey code and binary-coded-decimal. This type of converter is relatively slow because the signal must be processed once by each stage in turn.

The second category is typified by a parallel converter with $2n$ comparators, each having an output line. This type of converter requires that the output lines be combined in a prescribed fashion to provide a binary output. For example, if there are eight comparators and a simple binary number output is required, the eight outputs must be combined to provide a three bit binary word. This is the simplest type of analog-to-digital converter and is commonly referred to as a "flash encoder." In this type of converter, each one of the $2n$ comparator circuits has its threshold biased one-half $n$ of full scale above the preceding comparator circuit. The inputs of all of the comparators are connected in parallel and connected to the input voltage. If the input voltage is above any of the comparator thresholds, those comparators will be turned on putting a "1" on their respective output lines.

The third category is represented by the parallel type converter with $n$ comparator circuits and $n$ output lines. This converter is basically different from the second category in that any, none, or all of the comparator circuits are capable of producing "1's" so that $2n$ combinations of conditions of the comparator circuits are possible. This result is achieved by, in essence, converting the binary outputs to an analog level and subtracting each from the analog input thereby reducing the analog input to the separate comparator circuits. A resistor network is commonly used to perform the subtraction. Unfortunately, the resistor networks tend to slow down the operation of the converter and also to introduce error.

The fourth category involves the use of a Parallel-Parallel technique which is actually a combination of two separate analog-to-digital converters and a digital-to-analog converter.

The input analog signal to be converted is first encoded into an $n$ bit binary word by a flash encoder. This $n$ bit binary word is converted through a digital-to-analog converter and then subtracted from the input signal and the remainder is then digitized through an $n$ bit flash encoder, providing the $n$ least significant bits. This system therefore provides an output of $2n$ bits, and is commonly used at the present time in applications requiring fast analog-to-digital conversions. Its circuit complexity is not as great as that of the sole flash encoder but it is not as accurate.

The variable threshold techinque provides for a minimum of circuitry as well as a high degree of accuracy, which will be described in detail below.

BRIEF SUMMARY OF THE INVENTION

The analog voltage to be converted has one input to each of $n$ comparators. The other input to the comparators is that which sets the voltage threshold for each comparator. The comparator in the preferred embodiment produces a voltage at its output, arbitrarily designated a binary "1" when the analog voltage input is greater than the voltage threshold.

The threshold voltage circuit for each of the $n$ comparartors is comprised of a current generator which produces a fixed amount of current which is conducted through a resistor. Additional current generators which produce prescribed amounts of current may also be switched into the threshold voltage circuits, depending upon the state of others of the comparators and the particular code desired. Switching additional current into the individual threshold voltage circuit increases the voltage threshold by a predetermined amount. Therefore, if the analog voltage input should cause a more significant comparator to assume the "1" state and a less significant comparator to assume the "0" state, the output of the more significant comparator can be used to switch additional current into the threshold voltage circuit of the less significant state thereby raising the threshold past the point where the less significant comparator will assume the "1" state.

It is an object of this invention to provide an analog-to-digital converter which converts an analog to a digital representation at a high conversion rate.

Another object is to provide an analog-to-digital conversion with a minimum of circuitry.

Still another object of this invention is to provide an analog-to-digital converter utilizing comparator circuits which jointly contain the digital representation without further translation.

Still another object of this invention is to provide an analog-to-digital converter having comparator circuits in which the voltage thresholds of the comparator circuits may be selectively altered as determined by the binary code desired and the state of the comparator circuits.

These and other objects will be evident in the detailed description that follows.

BRIEF DESCRIPTION OF THE DRAWINGS

FIG. 3 is a chart illustrating the various combination of states of the comparators of FIG. 2.

DETAILED DESCRIPTION OF THE INVENTION

Figure 1:
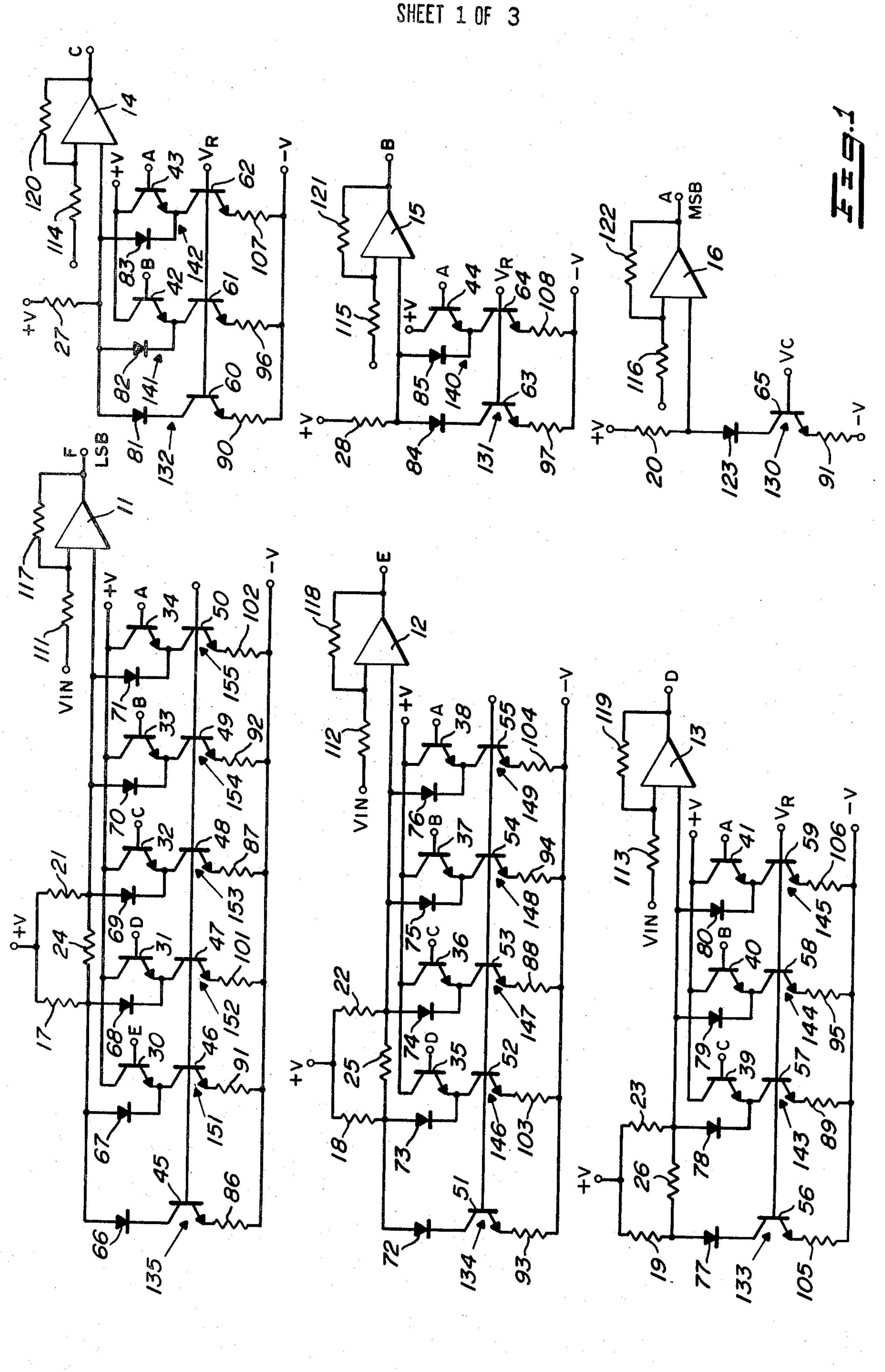
FIG. 1 is a schematic drawing illustrating a six-bit variable threshold converter.

Referring first to the schematic diagram of FIG. 1, comparators 11 through 16 are shown, with comparator 11 representing the least significant bit (LSB) and comparator 16 representing the most significant bit (MSB) in a simple binary number embodiment. Resistors 111 through 116 serve as input resistors to the input terminals of comparators 11 through 16 respectively with the other end of each of the resistors 111 through 116 being connected in parallel to a terminal for receiving the analog voltage to be converted. Comparators 11 through 16, which may be operational amplifiers are exemplified by Motorola part No. MC1414, are each provided with a negative feedback resistor, 117 through 122. Each of the comparators 11 through 16 also has a threshold input terminal to which a threshold voltage circuit is attached, described in detail below. Consider first the MSB position having an output designated "A" from comparator 16, a resistor 20 having one end connected to a source of positive potential and the other end connected to a junction of a threshold terminal of comparator 16 and current source 130. Current source 130 is comprised of resistor 91, transistor 65, and diode 123. One end of resistor 91 is tied to a source of negative potential and the other end is tied to the emitter of transistor 65 whose base is tied to a voltage source sufficient to cause a desired amplitude of current out of current source 130. The collector of transistor 65 is connected to the cathode of a diode 123 whose anode is connected to a junction between resistor 20 and the threshold terminal of comparator 16. The current supplied by current source 130 flows through resistor 20 and produces a voltage threshold of a predetermined amplitude on the threshold terminal of comparator 16 so that when the analog voltage input to be converted is higher than the voltage present at the threshold terminal of comparator 16, comparator 16 produces output A equal to "1" and when the analog voltage is below the voltage threshold, output A equals "0." Note that in this preferred embodiment, the voltage threshold supplied to comparator 16 is constant and is not subject to a variance.

Next consider comparator 15, which is second in binary rank to comparator 16. It has a current source 131 comprised of a resistor 97, a transistor 63 and a diode 84, all connected in the same fashion as described above for current source 130. Current source 131 is tied to the threshold terminal of comparator 15 and to one end of resistor 28 whose other end is tied to a positive source potential. An additional current source 140 is also tied to the one end of resistor 28 and the threshold terminal of comparator 15. Current source 140 is comprised of resistor 108, transistor 64 and diode 85, all arranged in the same manner as described above for the case of current source 130. It should be kept in mind, however, that resistor 108 is of a value to produce a desired current output from source 140 and is not necessarily the same as the corresponding resistor in either current sources 130 or 131. Current source 140 has a transistor switch 44 connected to it. Transistor switch 44 has its collector tied to a positive voltage source and its emitter tied to the cathode of diode 85 and the collector of transistor 64. The base of transistor switch 44 is connected to the output of comparator 16. Therefore, if output A from comparator 16 is "0," it is obvious that the analog voltage input is not of sufficient amplitude to cause an output from comparator 16. Under those circumstances, transistor switch 44 is not activated and current source 140 provides no current through resistor 28. However, if output A equals "1," then transistor switch 44 is activated and additional current is sent by current source 140 through resistor 28. This additional current through resistor 28 causes a variance in the voltage threshold provided to the threshold input of comparator 15 thereby requiring a higher value of the analog voltage input to cause output B to equal "1" when output A equals "1," than when output A equals "0."

The threshold input circuit for comparator 14 is comprised of current sources 132, 141 and 142, each available to supply current through resistor 27 but with the providing of current by current sources 142 and 141 being dependent on the state of transistor switches 42 and 43 respectively. Each of these current sources is made up of components connected as described above with current source 132 being comprised of resistor 90, transistor 60 and diode 81. Current source 141 is comprised of resistor 96, transistor 61 and diode 82. Current source 142 is comprised of resistor 107, transistor 62 and diode 83. A transistor switch 42 is connected to current source 141 in the same fashion as is transistor switch 44 connected to current source 140 described above. In the same fashion, transistor switch 43 is connected to current source 142. When output A from comparator 16 equals "1," transistor switch 43 is activated and current from current source 142 flows through resistor 27 together with current continuously supplied from current source 132 thereby increasing the voltage threshold. Transistor switch 42 has its base connected to the output B of comparator 15 so that when B equals "1," then transistor switch 42 is activated thus permitting current from current source 141 to flow through resistor 27, thereby varying the voltage threshold.

Included in the threshold circuitry for comparator 13 are current sources 133, 143, 144 and 145 comprised, respectively, of resistors 105, 89, 95, and 106, transistors 56, 57, 58 and 59, and diodes 77, 78, 79 and 80. The connection between these components to form the respective current sources is exactly as described above for other current sources. Current sources 143, 144 and 145 are provided with transistor switches 39, 40 and 41 respectively, all connected as described above. Current sources 143, 144 and 145 are connected together and to the threshold terminal of comparator 13 and to the junction between resistors 23 and 26. Current source 133 is connected between the junction of resistors 26 and 19. The other ends of resistors 19 and 26 are connected together to a positive voltage source. Instead of having a single resistor connected between the positive voltage source and the current sources as in the cases of the higher order bits described, additional resistors 23 and 26 have been added to provide appropriate currents for varying the voltage threshold a prescribed amount depending upon the current sources that have been switched into the threshold circuit. The bases of transistor switches 41, 40 and 39 are connected to the outputs of comparators 16, 15 and 14.

The threshold voltage circuit associated with comparator 12 includes current sources 134, 146, 147, 148 and 149, comprised respectively, of resistors 93, 103, 88, 94 and 104, transistors 51, 52, 53, 54 and 55, and diodes 72, 73, 74, 75 and 76. These components are arranged as in all current generators described earlier. Current generators 73, 74, 75 and 76 are provided with transistor switches 35, 36, 37 and 38 respectively, whose bases are connected respectively to outputs A, B, C and D from comparators 16, 15, 14 and 13. Current sources 147, 148 and 149 are connected together to the junction between resistors 22 and 25, and the threshold terminal of comparator 12. Current sources 134 and 146 are connected together to the junction between resistors 18 and 25. Resistors 18 and 22 are connected together at the other end to a source of positive potential.

Finally, with reference to comparator 11, the threshold circuitry includes current sources 150, 151, 152, 153, 154 and 155 which are comprised, respectively, of resistors 86, 91, 101, 87, 92 and 102, transistors 45, 46, 47, 48, 49 and 50, and diodes 66, 67, 68, 69, 70 and 71. Current sources 151, 152, 153, 154 and 155 are provided, respectively, with transistor switches 30, 31, 32, 33 and 34 all connected as indicated for other combinations of transistor switches and current sources. Current sources 153, 154 and 155 are all connected to the threshold terminal of comparator 11 and to the junction between resistors 21 and 24. Current sources 135, 151 and 152 are connected together to the junction between resistors 17 and 24. The other ends of resistors 17 and 21 are tied to a source of positive potential.

The detailed description illustrates the use of diodes and bipolar transistors. The application, of course, includes diode-connected transistors and field effect transistors in discrete or integrated form.

MODE OF OPERATION

Figure 2:
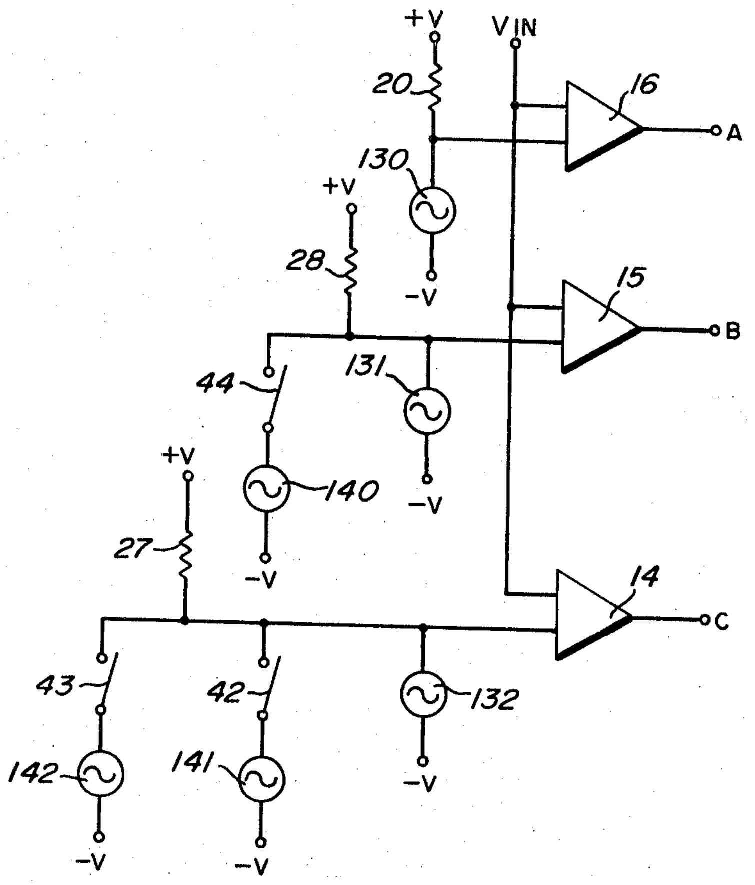
FIG. 2 is a simplified schematic of the upper three-bits of FIG. 1.

FIG. 2 illustrates the three most significant bits, in simplified form, of FIG. 1. For ease of correlation and explanation, parts have been labeled with the same numbers as in FIG. 1. FIG. 2 is, of course, representative of any three-bit analog-to-digital converter of the type herein described. Also, the system can be greatly expanded, with its mode of operation being identical to that described below, but with more corresponding circuitry and attendant additional complexity.

The analog voltage to be converted (Vin) is shown present at the input of each of the comparators 14, 15 and 16. The other input to each of the comparators is that which sets the voltage threshold of the respective comparator.

Comparator 16 has a fixed threshold circuit having a current generator 130 which produces a fixed amount of current (four units) to conduct through resistor 20. The resultant voltage sets the threshold of comparator 16 so that the output A of comparator 16 equals "1" only when Vin is larger than the voltage threshold at the threshold terminal of comparator 16.

Comparator 15 has a threshold circuit having current generators 131 and 140, with generator 140 being switched in and out of the circuit by transistor switch 44 (shown as a simple switch for illustrative purposes) which is controlled by output A from comparator 16.

The threshold circuit for comparator 14 is comprised of current generators 132, 141 and 142. Current generator 132 causes 1 unit of current to flow through resistor 27. A "unit" of current is an arbitrary designation and is used herein for convenience. Current generator 141, which is switched in and out of the circuit by transistor switch 42 which in turn is controlled by the output B of comparator 15, produces a current of two units available to be switched through resistor 27. Current generator 142, which is switched in and out of the circuit by transistor switch 43, which in turn is controlled by the output A of comparator 16, provides four units of additional current, available to flow through resistor 27.

If Vin is of such an amplitude so as to produce a "1" digital output, the voltage produced by the one unit of current from current generator 132 is overcome by Vin, turning on comparator 14 causing output C to equal "1". The threshold of comparator 15 and that of comparator 16 each have parameter values so that their respective voltage thresholds are not overcome by Vin. Of course, when Vin is of such a value so as to produce a binary "0," Vin will not overcome the voltage threshold of comparator 14 so that comparators 14, 15 and 16 will each have a "0" output. FIG. 3 is a chart illustrating the relationship between decimal numbers and binary numbers showing the required outputs of comparators 14, 15 and 16 for any given decimal number.

If Vin is of such a value so as to produce a binary "010" output, then comparator 15 is turned on because Vin overcomes the voltage threshold established by two units of current produced by current source 131 and conducted through resistor 28. However, comparator 14 is also turned on because its voltage threshold is substantially below that of comparator 15. When comparator 15 is turned on, output B equals "1" and activates switch 42, thereby permitting two units of current generated by current source 141, in addition to the one unit of current from current generator 132, to flow through resistor 27 thus raising the voltage threshold of comparator 14 and causing it to change states so that C equals "0." Comparator 16 has a voltage threshold higher than Vin in this case and therefore A equals "0."

When Vin is of an amplitude so as to be represented by a binary "011," both comparators 14 and 15 are again turned on but in this instance, the additional two units of current from current source 141 are not sufficient to cause the voltage threshold of comparator 14 to rise to a value sufficient to cause comparator 14 to change state and therefore both outputs B and C equal "1" while output A remains equal to "0."

When Vin is of an amplitude so as to be represented by a binary "100," the voltage threshold provided for comparator 16 by four units of current flowing from current source 130 through resistor 20 is overcome and output A equal "1." Of course, both of the voltage thresholds supplied for comparators 14 and 15 are also overcome. When output A equal "1," switch 44 is activated, permitting four additional units of current to flow from current source 140 through resistor 28 thereby raising the voltage threshold applied to comparator 15 and causing output B to equal "0." Output A also causes switch 43 to operate permitting current source 142 to cause four more units of current to flow through resistor 27, raising the voltage threshold at comparator 14 sufficiently high to cause it to change state so that output C equals "0."

When Vin is representative of a binary "101," all of comparators 14, 15 and 16 are initially turned on. Similar to the other cases, when comparator 16 is turned on so that output A equals "1," the voltage threshold provided at comparator 15 is raised high enough to cause comparator 15 to change state so that output B equals "0." Comparator 14 has its voltage threshold at a point determined by one unit of current from current source 132 and four units of current from current source 142 flowing through resistor 27 which is overcome by Vin so that output C equals "1."

When Vin equals "110," comparators 14, 15 and 16 are turned on. This time, the voltage threshold at comparator 15 is overcome by Vin as is the voltage threshold at comparator 16. The voltage threshold at comparator 14 is that produced by four units of current from current source 142, one unit of current from current source 132 and two units of current from current source 141 because with output B equal to "1," switch 42 is activated permitting the additional two units of current from current source 141 to flow through resistor 27. The voltage threshold thus produced at comparator 14 is sufficient to cause comparator 14 to change state so that output C equals "0."

Finally, when the amplitude of Vin is of a magnitude to be represented by a binary "111," the total voltage threshold available at each of comparators 14, 15 and 16 is overcome so that outputs A, B and C are all equal to "1."

It can be seen that the voltage threshold settings for comparators 16, 15 and 14 are respectively Vin/2, Vin/4 and Vin/8. However, these voltage thresholds are changed at appropriate points and in such a manner that the output of comparators 14, 15 and 16 reflect the binary count or code. While the example shown is for a simple binary count, a binary-coded-decimal, a Grey code or other code could be provided by appropriate connections.

It should be noted that in this system, the output A, for example, from the MSB is available in one comparator delay time after Vin is applied to the input. If the output were to be sampled at that time or subsequent to it, the error could not be more then 50 percent. Similarly, the next most significant output, for example output B, is available in two comparator delay times plus the settling time of the threshold voltage circuit involving the switching in of additional current from current source 140. This is true of all bit positions in the binary output and can be represented by the formula:

$$t = mt_c + (m - 1)\, t_d$$

where $m$ is the bit rank number (starting with 1 for the MSB), $t_c$ is the time delay of a comparator and $t_d$ is the settling time. It is apparent that in operation this invention provides the most significant bits first. Therefore, if the output were taken before the conversion had been completed, the error would be in the least significant bits only. Therefore, useful information is available prior to the total conversion.

The system described herein is a clockless, nonsynchronous type of analog-to-digital converter. It is wholly within the contemplation of this invention that it could be made into a completely synchronous, clocked type of system by the addition of appropriate clocking and delay circuits.

What is claimed is:

1. An analog-to-digital converter having input means for receiving an input analog voltage to be converted to a digital representation of *n* bits wherein a first voltage level is designated a binary "1" and a second voltage level is designated a binary "0," comprising:

a. *n* comparator means, each having an input terminal connected to the input means, a threshold terminal for receiving a voltage threshold and an output terminal for providing either a binary "1" or a binary "0," determined by the relative amplitudes of the analog input voltage and the voltage threshold establishing a "1" or "0" state of the comparator means;

b. *n* threshold voltage circuit means, each connected to the threshold terminal of a corresponding one of the *n* comparator means for providing a voltage threshold to the respective threshold terminal;

c. at least one varying circuit means for varying at least one of the voltage thresholds;

d. at least one switching circuit means, operatively connected to the output terminal of one of the *n* comparator means, responsive to the state of the comparator means, for connecting the varying circuit means to the threshold voltage circuit means connected to the threshold terminal of another of the n comparator means to vary the voltage threshold if the switching circuit means are activated; and e. said *n* comparator means being responsive to the applied analog input signal for asynchronously generating binary information at said plurality of *n* comparator output terminals in accordance with the delay time of said *n* comparator means.

2. The analog-to-digital converter of claim 1 wherein each of the *n* threshold voltage circuit means further comprise:

b. i. an electrical impedance connected to the threshold terminal of a respective one of the *n* comparator means at one end and to a voltage reference at the other end; and ii. a current source connected to the impedance and the threshold terminal of the respective one of the *n* comparator means, the current source providing a current flow through the impedance of a predetermined amount to provide a predetermined voltage threshold.

3. The analog-to-digital converter of claim 2 wherein the varying circuit means further comprise at least one current source connected to the switching circuit means and adjusted to provide a predetermined current which, when combined with the corresponding threshold current, provides a new voltage threshold of an amplitude that is a predetermined amount different from the original voltage threshold.

4. The analog-to-digital converter of claim 3 wherein the switching circuit means further comprise a semiconductive switching device having a control electrode operatively connected to the output terminal of one of the *n* comparator means, and a pair of main electrodes operatively connected to at least one current source of the varying circuit means to permit current to flow from the current source.

5. The analog-to-digital converter of claim 4 wherein the *n* comparator means each comprise an operational amplifier.

6. The analog-to-digital converter of claim 4 wherein the *n* comparator means each comprise a differential amplifier.

7. An analog-to-digital converter for converting an analog input voltage into a binary number digital representation of *n* bits wherein one voltage level is designated "1" and another voltage level is designated "0," having input means for receiving the analog input voltage comprising:

a. *n* comparator means, each having an input terminal connected to the input means, a threshold terminal for receiving a voltage threshold and an output terminal for providing a voltage representative of a binary "1" when the analog input voltage exceeds the voltage threshold, and for providing a voltage representative of a binary "0" when the voltage threshold exceeds the analog input voltage;

b. *n* threshold voltage circuit means, each connected to the threshold terminal of a respective one of the comparator means, wherein the threshold voltage circuit means, connected to the threshold terminal of the comparator means representing the most significant bit produces a voltage threshold that is one-half the amplitude of the analog input voltage, and wherein each of the remaining *n* threshold voltage circuit means produces a voltage threshold at the threshold terminal of the respective comparator means that is one-half the amplitude of the voltage threshold at the threshold terminal of the comparator means representative of the next more significant bit;

c. $n-1$ varying circuit means, for varying the voltage threshold at all of the *n* comparator means except the comparator means representative of the most significant bit;

d. $n-1$ switching circuit means operatively connected to the output terminals of each of the respective comparator means except the comparator means representative of the least significant bit, responsive to the binary state of the output terminals, and operatively connected to respective ones of the $n-1$ varying circuit means, for increasing the voltage threshold when the outputs of any of the comparator means representing more significant bits are a binary "1"; and e. said *n* comparator means being responsive to the applied analog input signal for asynchronously generating binary information at said plurality of *n* comparator output terminals in accordance with the delay time of the said *n* comparator means.

8. The analog-to-digital converter of claim 7 wherein each of the *n* threshold voltage circuit means further comprise:

a. an electrical impedance connected to the threshold terminal of a respective one of the *n* comparator means at one end, and to a voltage reference at the other end; and b. a current source connected to the impedance and the threshold terminal of the respective one of the *n* comparator means for producing a threshold voltage at the threshold terminal.

9. The analog-to-digital converter of claim 8, wherein the $n-1$ switching circuit means further comprise a plurality of semiconductive switching devices, each output terminal having one switching device operatively connected to it and to each of the $n-1$ varying circuit means connected to the threshold terminals of the comparator means representative of less significant bits.

10. The analog-to-digital converter of claim 9 wherein the varying circuit means further comprise a plurality of current sources, each providing a predetermined amount of current, each current source being connected to a respective one of the semiconductive switching devices and to a respective one of the threshold voltage circuit means.

11. The analog-to-digital converter of claim 10 wherein the comparator means are each an operational amplifier.

12. The analog-to-digital converter of claim 10 wherein the comparator means are each a differential amplifier.

* * * * *